(12) United States Patent
Lin et al.

(10) Patent No.: US 12,009,459 B2
(45) Date of Patent: Jun. 11, 2024

(54) LIGHT-EMITTING DEVICE, LIGHT-EMITTING ASSEMBLY, AND INTEGRATED CIRCUIT FLIP-CHIP

(71) Applicant: LITE-ON TECHNOLOGY CORPORATION, Taipei (TW)

(72) Inventors: Chen-Hsiu Lin, New Taipei (TW); Min-Hsi Chen, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 361 days.

(21) Appl. No.: 17/391,014

(22) Filed: Aug. 1, 2021

(65) Prior Publication Data

US 2022/0052230 A1 Feb. 17, 2022

Related U.S. Application Data

(60) Provisional application No. 63/065,547, filed on Aug. 14, 2020.

(30) Foreign Application Priority Data

May 6, 2021 (CN) .......................... 202110492505.4

(51) Int. Cl.
| | |
|---|---|
| *H01L 33/48* | (2010.01) |
| *H01L 25/075* | (2006.01) |
| *H01L 33/38* | (2010.01) |
| *H01L 33/62* | (2010.01) |
| *H01L 33/64* | (2010.01) |

(52) U.S. Cl.
CPC ........ *H01L 33/486* (2013.01); *H01L 25/0753* (2013.01); *H01L 33/38* (2013.01); *H01L 33/62* (2013.01); *H01L 33/642* (2013.01); *H01L 33/644* (2013.01); *H01L 33/647* (2013.01)

(58) Field of Classification Search
None
See application file for complete search history.

(56) References Cited

U.S. PATENT DOCUMENTS

| | | | |
|---|---|---|---|
| 9,705,052 B1 * | 7/2017 | Lin ........................ | H01L 33/642 |
| 2015/0034989 A1 * | 2/2015 | Namiki ..................... | C09J 9/02 |
| | | | 252/514 |
| 2018/0254226 A1 * | 9/2018 | Iguchi ................... | H01L 27/156 |

\* cited by examiner

*Primary Examiner* — Feifei Yeung Lopez
(74) *Attorney, Agent, or Firm* — Li & Cai Intellectual Property Office

(57) ABSTRACT

A light-emitting device, a light-emitting assembly and an integrated circuit (IC) flip-chip are provided. The light-emitting device includes the IC flip-chip, a plurality of light-emitting diode (LED) flip-chips and a substrate. The IC flip-chip includes a plurality of flip-chip pads. The LED flip-chips are spaced apart from the IC flip-chip. The substrate carries the IC flip-chip and the LED flip-chips. The LED flip-chips have a plurality of electrodes, and the flip-chip pads of the IC flip-chip and the electrodes of the LED flip-chips are disposed on the substrate by way of soldering. The LED flip-chips are electrically coupled to the IC flip-chip through the substrate.

16 Claims, 12 Drawing Sheets

LIGHT-EMITTING DEVICE, LIGHT-EMITTING ASSEMBLY, AND INTEGRATED CIRCUIT FLIP-CHIP

CROSS-REFERENCE TO RELATED PATENT APPLICATION

This application claims priority to the U.S. Provisional Patent Application Ser. No. 63/065,547, filed on Aug. 14, 2020, which application is incorporated herein by reference in its entirety.

This application claims priority to the China Patent Application No. 202110492505.4, filed on May 6, 2021, which application is incorporated herein by reference in its entirety.

Some references, which may include patents, patent applications, and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an integrated circuit chip, and more particularly to a light-emitting device, a light-emitting assembly, and an integrated circuit flip-chip.

BACKGROUND OF THE DISCLOSURE

Conventional integrated circuit (IC) chips for driving light-emitting diode (LED) flip-chips are equipped with a plurality of wire bonding pads that are only suitable for wire bonding. However, the structure of any light-emitting device with the conventional IC chips will be affected by the wire bonding pads, thereby hindering further improvements to the light-emitting device with the conventional IC chips.

SUMMARY OF THE DISCLOSURE

In response to the above-referenced technical inadequacies, the present disclosure provides a light-emitting device, a light-emitting assembly, and an integrated circuit flip-chip.

In one aspect, the present disclosure provides a light-emitting device that includes an integrated circuit (IC) flip-chip, a plurality of light-emitting diode (LED) flip-chips, and a substrate. The IC flip-chip includes a plurality of flip-chip pads. The LED flip-chips are spaced apart from the IC flip-chip. The substrate carries the IC flip-chip and the LED flip-chips, and the LED flip-chips have a plurality of electrodes. The flip-chip pads of the IC flip-chip and the electrodes of the LED flip-chips are disposed on the substrate by way of soldering. The LED flip-chips are electrically coupled to the IC flip-chip through the substrate.

In certain embodiments, the IC flip-chip includes a chip body, a plurality of metal pads, a redistribution layer, a metal layer, and a solder mask layer. The metal pads are disposed on a surface of the chip body, edges of the metal pads define a layout boundary, and the metal pads are arranged within the layout boundary. The redistribution layer is formed on the surface of the chip body, and the metal pads are embedded in the redistribution layer. The metal layer is disposed on the redistribution layer and is electrically coupled to the metal pads through the redistribution layer. The solder mask layer has a plurality of openings and is disposed on the metal layer. The flip-chip pads are defined by the metal layer to be exposed from the solder mask layer through the openings, and the flip-chip pads are arranged within the layout boundary. At least one of the flip-chip pads is spaced apart from the layout boundary.

In certain embodiments, each of the flip-chip pads has a same area, and the area of any one of the flip-chip pads is larger than an area of the metal pad that is electrically coupled thereto.

In certain embodiments, the substrate includes a first insulation layer, a first metal layer, a second insulation layer, a second metal layer, and a third metal layer. The first metal layer is formed on the first insulation layer, and the first metal layer includes an integrated circuit (IC) chip bonding region and a light-emitting diode (LED) chip bonding region. The second insulation layer and the first metal layer are respectively arranged on two opposite sides of the first insulation layer. The second metal layer and the third metal layer are electrically coupled to each other, and the LED chip bonding region is electrically coupled to the IC chip bonding region through the second metal layer. The third metal layer is arranged on a side of the second insulation layer away from the first insulation layer.

In certain embodiments, the substrate includes an upper solder mask layer and a lower solder mask layer. The upper solder mask layer is formed on the first insulation layer, and a plurality of perforations are formed on the upper solder mask layer, so as to expose the IC chip bonding region and the LED chip bonding region. The lower solder mask layer is disposed on the second insulation layer and is arranged adjacent to the third metal layer.

In certain embodiments, the upper solder mask layer has a light-emitting diode (LED) chip solder mask area and an integrated circuit (IC) chip solder mask area. The LED chip solder mask area and the IC chip solder mask area are spaced apart from each other, and the perforations are formed on each of the LED chip solder mask area and the IC chip solder mask area.

In certain embodiments, the light-emitting device further includes a surrounding wall and a light-permeable package body. The surrounding wall is disposed on the substrate to define a first accommodating space and a second accommodating space. The IC flip-chip is arranged in the first accommodating space, and the LED flip-chips are arranged in the second accommodating space. The light-permeable package body is filled at least in the second accommodating space, and the LED flip-chips are embedded in the light-permeable package body.

In certain embodiments, the light-permeable package body has a light emergent surface. The light emergent surface is parallel to the substrate and faces toward a side that is away from the substrate, or is perpendicular to the substrate and faces toward a side that is away from the IC flip-chip.

In certain embodiments, the surrounding wall further defines a third accommodating space, and the first accommodating space is arranged between the second accommodating space and the third accommodating space. The light-emitting device further includes a light sensor arranged in the third accommodating space.

In another aspect, the present disclosure provides a light-emitting assembly that includes an integrated circuit (IC) flip-chip, a plurality of light-emitting diode (LED) flip-chips, and a light-permeable package body. The IC flip-chip includes a plurality of flip-chip pads. The LED flip-chips are spaced apart from the IC flip-chip. The light-permeable package body is an integrally formed one-piece structure and covers the IC flip-chip and the LED flip-chips. The LED flip-chips have a plurality of electrodes, and the flip-chip pads of the IC flip-chip and the electrodes of the LED flip-chips are exposed outside of the light-permeable package body.

In yet another aspect, the present disclosure provides an integrated circuit (IC) flip-chip that includes a chip body, a plurality of metal pads, a redistribution layer, and a plurality of flip-chip pads. The metal pads are disposed on a surface of the chip body. The redistribution layer is formed on the surface of the chip body, and the metal pads are embedded in the redistribution layer. The flip-chip pads are disposed on the redistribution layer and are electrically coupled to the metal pads through the redistribution layer. The flip-chip pads and the metal pads each have a layout distribution, and the layout distribution of the flip-chip pads is more even than the layout distribution of the metal pads.

In certain embodiments, a projection area formed by an orthographic projection of the flip-chip pads on the surface of the chip body does not cover any one of the metal pads.

In certain embodiments, edges of the metal pads define a layout boundary, and the metal pads are arranged within the layout boundary. The layout boundary defines a nine-square grid area. The projection area is formed by an orthographic projection of the flip-chip pads on the surface of the chip body, and a number of spaces of the nine-square grid area on which the projection area is located is greater than a number of spaces of the nine-square grid area on which the metal pads are located.

In certain embodiments, edges of the metal pads define a layout boundary, and the metal pads are arranged within the layout boundary. Edges of part of the flip-chip pads are partially located on the layout boundary, and a remaining part of the flip-chip pads is spaced apart from the layout boundary.

In certain embodiments, the redistribution layer includes a first polymer layer, a wire extension layer, and a second polymer layer. The first polymer layer is formed on the surface of the chip body and is arranged at a periphery of the metal pads. The wire extension layer is disposed on the first polymer layer and the metal pads, and the wire extension layer is electrically coupled to the metal pads. The second polymer layer is arranged around the wire extension layer, and the wire extension layer protrudes out of the second polymer layer.

In certain embodiments, the redistribution layer includes a solder mask layer that is disposed on the second polymer layer and the wire extension layer, and the flip-chip pads are exposed from the solder mask layer.

Therefore, in the light-emitting device, the light-emitting assembly, and the integrated circuit flip-chip provided by the present disclosure, by virtue of "the IC flip-chip including the flip-chip pads", the IC flip-chip can be applied in a flip-chip process. Accordingly, at a time when terminal devices are developed toward being lighter and thinner, a light-emitting device, a light-emitting assembly, and an IC flip-chip that are thinnest and smallest in size can be provided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
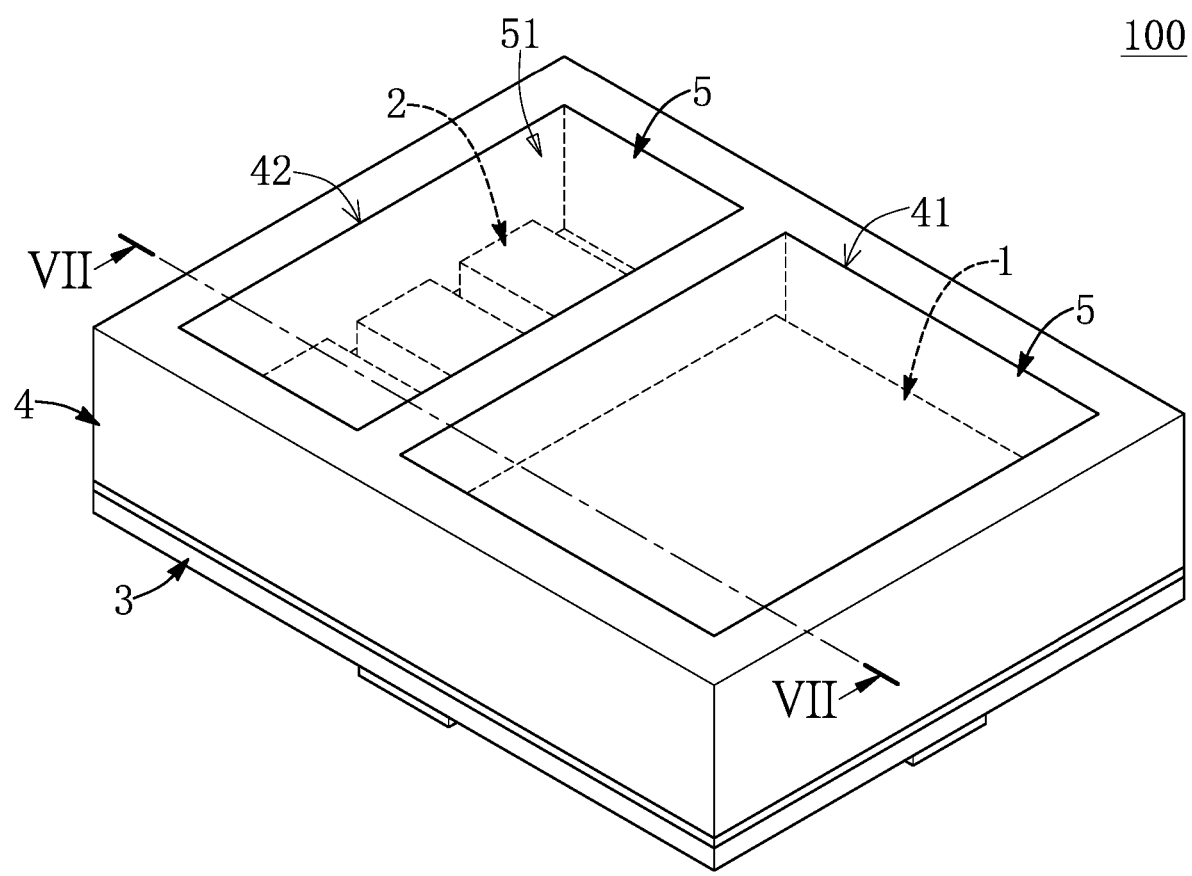
FIG. 1 is a perspective view of a light-emitting device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
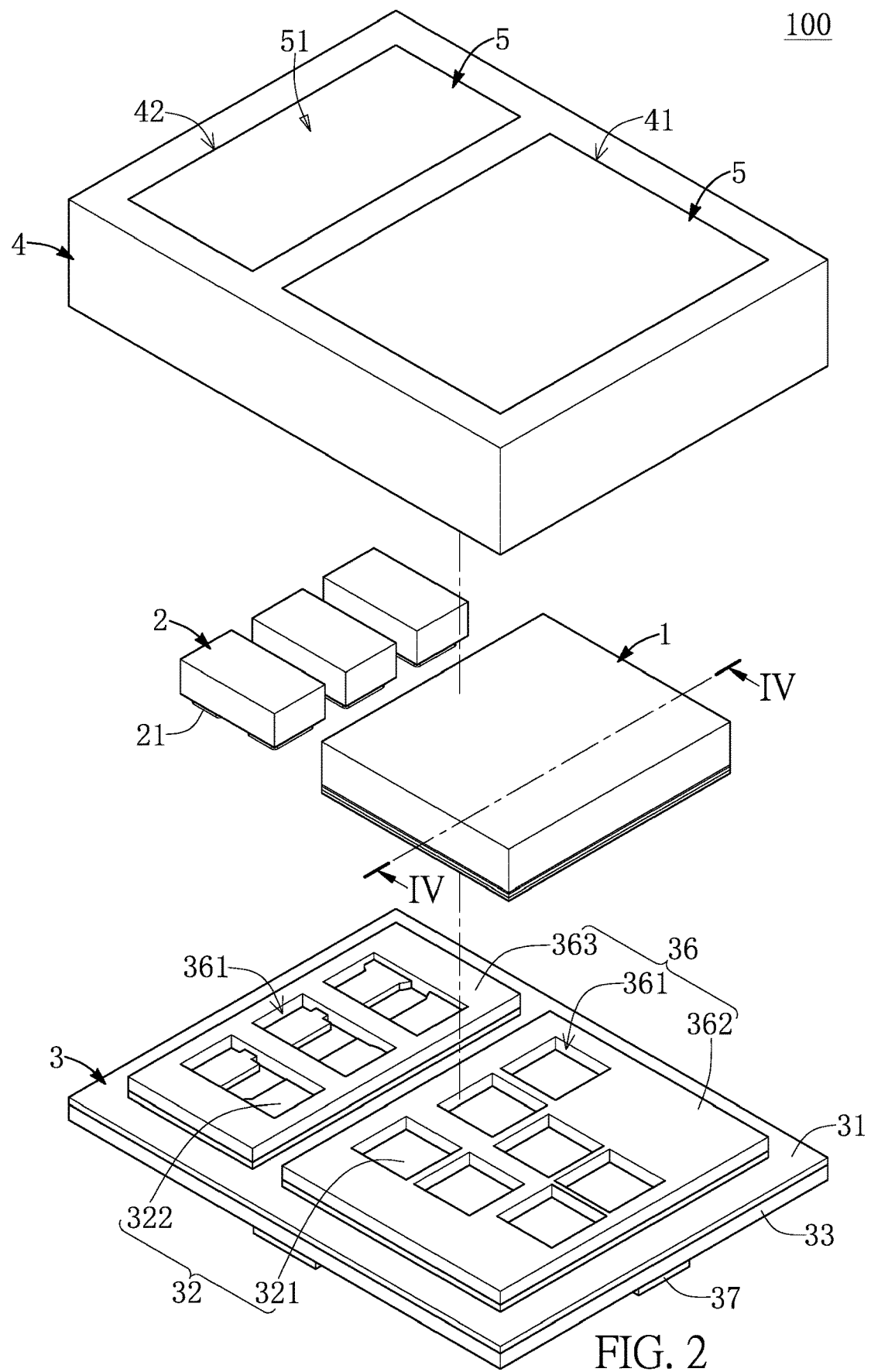
FIG. 2 is an exploded view of FIG. 1.

Referring to FIG. 1 to FIG. 7, a first embodiment of the present disclosure is shown. As shown in FIG. 1 and FIG. 2, a light-emitting device (or a light-emitting diode package structure) 100 is provided. The light-emitting device 100 includes an integrated circuit (IC) flip-chip 1, a plurality of light-emitting diode (LED) flip-chips 2, a substrate 3, a surrounding wall 4, and a light-permeable package body 5. The IC flip-chip 1 and the LED flip-chips 2 are mounted on the substrate 3. For instance, a solder paste can be disposed on the substrate 3 through stencil apertures in a solder paste printing process. Accordingly, the IC flip-chip 1 and the LED flip-chips 2 can be mounted on the substrate 3 through the solder paste.

The entire thickness of the light-emitting device 100 of the present disclosure can be reduced by replacing solder ball (or solder bump) with the solder paste. The surrounding wall 4 is formed on the substrate 3 and surrounds outer sides of the IC flip-chip 1 and the LED flip-chips 2. The light-permeable package body 5 is disposed in the surrounding wall 4 and is formed on the substrate 3. Accordingly, the IC flip-chip 1 and the LED flip-chips 2 are embedded in the light-permeable package body 5.

It should be noted that the IC flip-chip 1 in the present embodiment is described with the above-mentioned components. However, the present disclosure is not limited thereto. For instance, in other embodiments not shown in the present disclosure, the IC flip-chip 1 can be independently used (e.g., sold) or can be used in cooperation with other components. The following description will describe the construction and connection relationship of each component of the light-emitting device 100.

Figure 3:
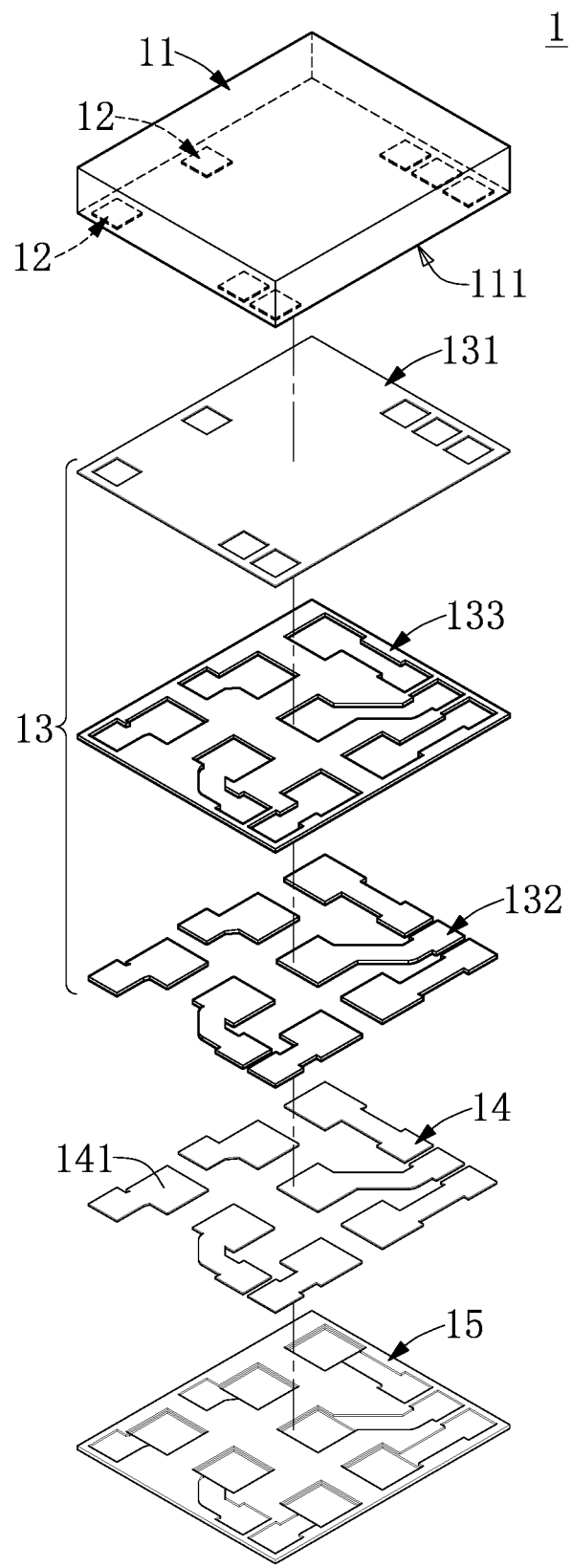
FIG. 3 is an exploded view of an integrated circuit (IC) flip-chip of FIG. 2.
Figure 4:
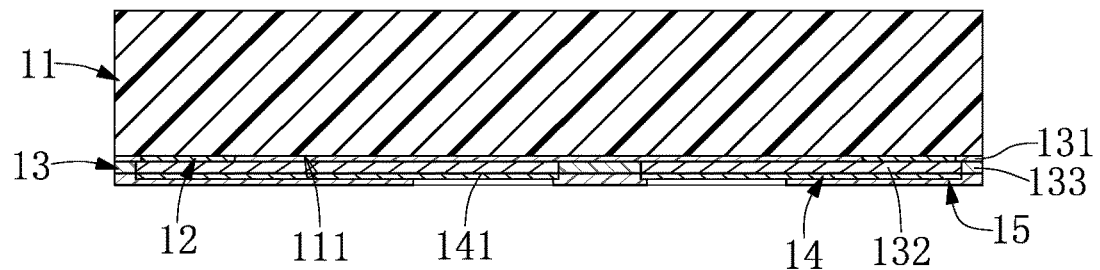
FIG. 4 is a cross-sectional view taken along line IV-IV of FIG. 2.
Figure 5:
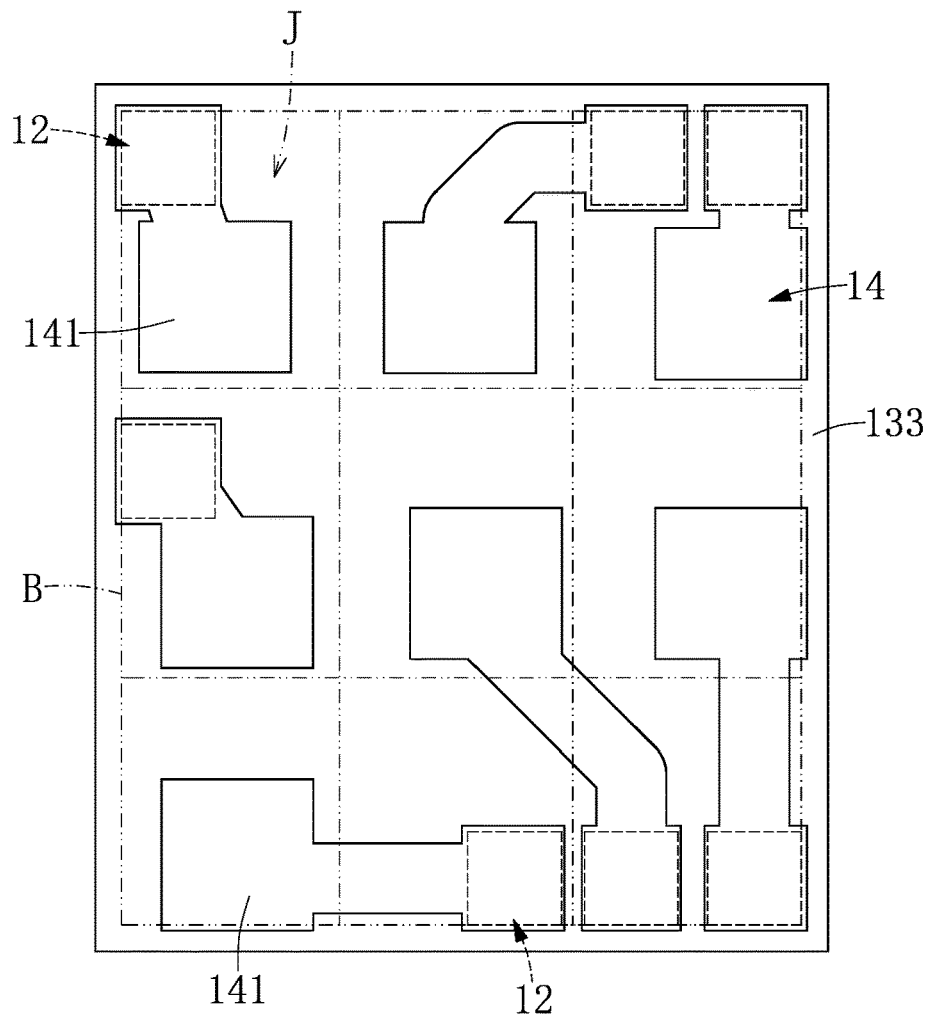
FIG. 5 is a bottom view of the IC flip-chip of FIG. 2 with a solder mask layer being omitted.

As shown in FIG. 3 to FIG. 5, the IC flip-chip 1 includes a chip body 11, a plurality of metal pads 12 electrically coupled to the chip body 11, a redistribution layer (RDL) 13 connected to the metal pads 12, a metal layer 14 connected to the redistribution layer 13, and a solder mask layer 15 covering the metal layer 14.

The solder mask layer 15 has a plurality of openings, and flip-chip pads 141 are defined by the metal layer 14 to be exposed from the solder mask layer 15 through the openings. The IC flip-chip 1 is bonded to the substrate 3 through the flip-chip pads 141.

The function of the chip body 11 (such as driving) corresponds to the LED flip-chips 2. The metal pads 12 are disposed on a surface 111 of the chip body 11 (e.g., a bottom surface of the chip body 11 in FIG. 3). The redistribution layer 13 is formed on the surface 111 of the chip body 11, and the metal pads 12 are embedded in the redistribution layer 13. The flip-chip pads 141 are disposed on the redistribution layer 13, and are electrically coupled to the metal pads 12 through the redistribution layer 13.

For instance, each of the metal pads 12 can be an aluminum pad that is suitable for wire bonding. That is, each of the metal pads 12 can be a wire bonding pad. Each of the metal pads 12 can further include an alloy layer. For instance, the alloy layer can be made of gold or nickel gold. The alloy layer can further be disposed on the aluminum pad.

Specifically speaking, through the redistribution layer 13, the metal pads 12 that are only suitable for a wire bonding process can extend their layout to form the flip-chips 141 that are suitable for a flip-chip process. For the sake of brevity, the redistribution layer 13 in the present embodiment is described with the following structure. However, the specific structure of the redistribution layer 13 can be adjusted and changed according to design requirements, and is not limited thereto.

The redistribution layer 13 has a multi-layer structure, and at least includes a first polymer layer 131, a wire extension layer 132, and a second polymer layer 133. The first polymer layer 131 is formed on the surface 111 of the chip body 11 and is arranged at a periphery of the metal pads 12. In the present embodiment, the first polymer layer 131 is coplanar with the metal pads 12 and is distributed on the entire surface 111.

The second polymer layer 133 is disposed on the first polymer layer 131, and the wire extension layer 132 is disposed on the first polymer layer 131 and the metal pads 12. The wire extension layer 132 is electrically coupled to the metal pads 12. The second polymer layer 133 is arranged around the wire extension layer 132, and the wire extension layer 132 is coplanar with the second polymer layer 133. The metal layer 14 is disposed on the wire extension layer 132 and protrudes out of a surface of the wire extension layer 132 and a surface of the second polymer layer 133.

Furthermore, the wire extension layer 132 can use materials that can be fixedly connected to the metal pads 12 (e.g., solder paste), and the metal layer 14 can use metal or alloy materials that can be wet and fixedly connected to the wire extension layer 132. Accordingly, the flip-chip pads 141 can use materials suitable for the flip-chip process. The metal layer 14 can be made of a wetting metal material or a wetting alloy material, such as gold or nickel gold.

The solder mask layer 15 is disposed on the metal layer 14, and the flip-chip pads 141 are exposed from the solder mask layer 15 through the openings. That is, a part of the metal layer 14 is embedded in the solder mask layer 15. More specifically, through the redistribution layer 13, the IC flip-chip 1 can enable the flip-chip pads 141 to be adjusted towards a plurality of faces suitable for the flip-chip process.

For instance, in the present embodiment, the material of any one of the flip-chip pads 141 (e.g., gold or nickel gold) is different from the material of any one of the metal pads 12 (e.g., aluminum). Each of the flip-chip pads 141 have a same area, and the area of any one of the flip-chip pads 141 is larger than an area of the metal pad 12 that is electrically coupled thereto. Accordingly, any one of the flip-chip pads 141 can have a stable connection in the flip-chip process.

Furthermore, through the redistribution layer 13, the IC flip-chip 1 can further enable the flip-chip pads 141 to be evenly distributed upon corresponding to the surface 111. That is, the flip-chip pads 141 and the metal pads 12 each have a layout distribution, and the layout distribution of the flip-chip pads 141 is more even than the layout distribution of the metal pads 12, so as to facilitate application in the flip-chip process.

For the sake of brevity, edges of the metal pads 12 define a layout boundary B in the present embodiment, and the metal pads 12 are arranged within the layout boundary B. It should be noted that the layout boundary B is shown in a square shape in the present embodiment. However, the present disclosure is not limited thereto.

Furthermore, the flip-chip pads 141 are arranged within the layout boundary B, and at least one of the flip-chip pads 141 is spaced apart from the layout boundary B. In the present embodiment, edges of part of the flip-chip pads 141 (e.g., the two flip-chip pads 141 respectively arranged at locations near bottom left and top right of FIG. 5) are partially located on the layout boundary B, and a remaining part of the flip-chip pads 141 is spaced apart from the layout boundary B. Accordingly, through the redistribution layer 13, the IC flip-chip 1 can enable at least one of the flip-chip pads 141 to move toward an inner side of the layout boundary B, so that the flip-chip pads 141 are evenly distributed upon corresponding to the surface 111.

Furthermore, to aid description of an even distribution of the flip-chip-pads 141 upon corresponding to the surface 111, the layout boundary B further defines a nine-square grid area J. The nine-square grid area J has nine spaces that are substantially of the same size.

The number of spaces of the nine-square grid area J on which the metal pads 12 are located is lower than the number of the flip-chip pads 141. That is, at least one of the spaces of the nine-square grid area J corresponds to at least two of the metal pads 12, so that the distribution of the flip-chip pads 141 is dense.

Furthermore, a projection area is formed by an orthographic projection of the flip-chip pads 141 on the surface 111 of the chip body 1. The projection area locates on the nine-square grid area J, and the number of spaces of the nine-square grid area J on which the projection area is located is equal to the number of the metal pads 141. That is, any one of the spaces of the nine-square grid area J corresponds to at most one of the flip-chip pads 141. Accordingly, the flip-chip pads 141 are arranged to be evenly distributed, so that the flip-chip pads 141 can achieve an even wetting and are not easy to rotate in the flip-chip process, thereby facilitating a stable connection.

In other words, the projection area is formed by the orthographic projection of the flip-chip pads 141 on the surface 111 of the chip body 11, and the number of spaces of the nine-square grid area J on which the projection area is located (e.g., seven in the present embodiment) is greater than the number of spaces of the nine-square grid area J on which the metal pads 12 are located (e.g., five in the present embodiment).

Furthermore, the projection area formed by the orthographic projection of the flip-chip pads 141 on the surface 111 of the chip body 11 does not cover any one of the metal pads 12. Accordingly, any one of the flip-chips 141 and the corresponding metal pads 12 will not interfere with each other and affect the yield rate caused by the formation of the redistribution layer 13.

Figure 6:
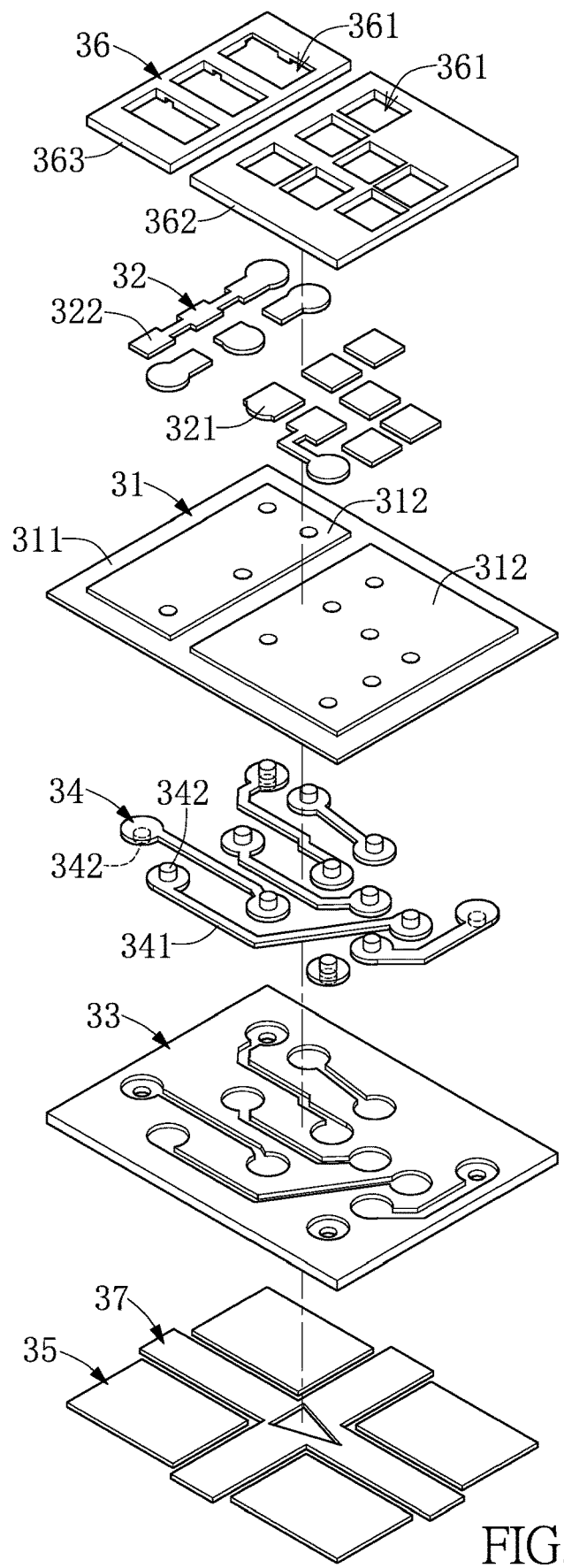
FIG. 6 is an exploded view of a substrate of FIG. 2.
Figure 7:
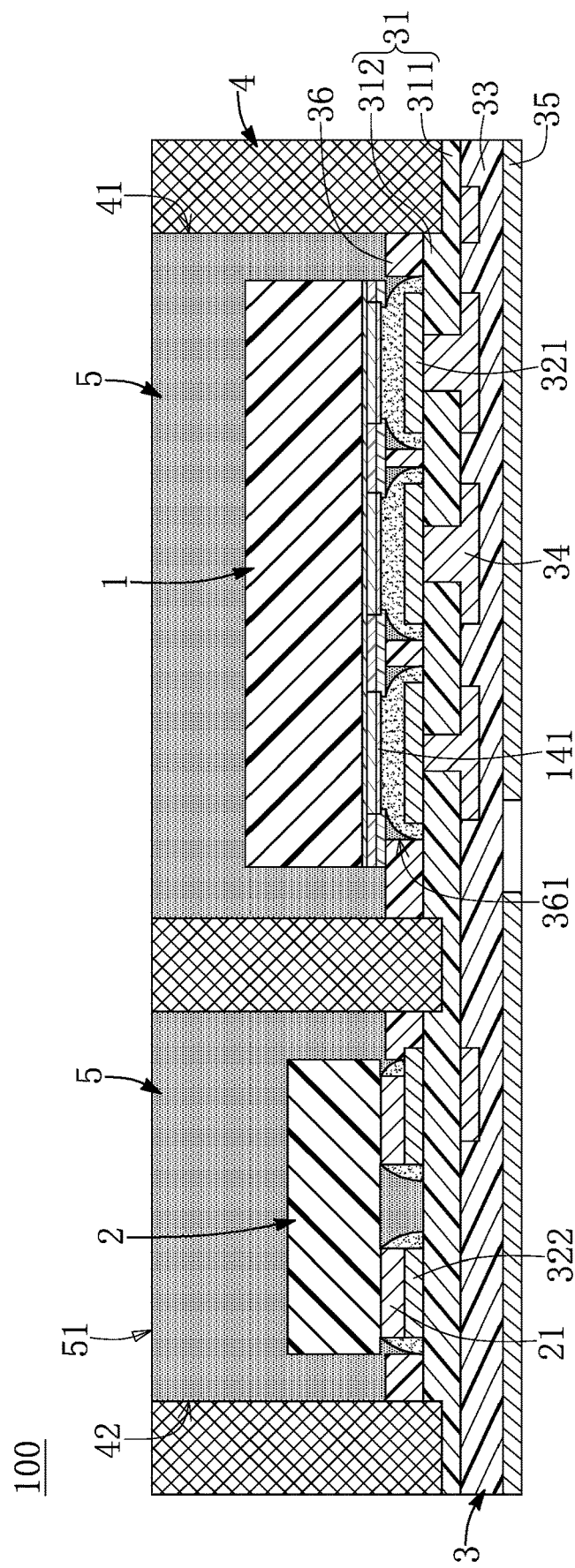
FIG. 7 is a cross-sectional view taken along line VII-VII of FIG. 1.

As shown in FIG. 2, FIG. 6, and FIG. 7, the substrate 3 carries the IC flip-chip 1 and the LED flip-chips 2, and the LED flip-chips 2 are spaced apart from the IC flip-chip 1. Furthermore, the LED flip-chips 2 have a plurality of electrodes 21, and the substrate 3 is electrically coupled to the flip-chip pads 141 of the IC flip-chip 1 and the electrodes 21 of the LED flip-chips 2.

Furthermore, in the flip-chip process, in order to enable the substrate 3 to be accurately connected to the flip-chip pads 141 of the IC flip-chip 1 and the electrodes 21 of the LED flip-chips 2, the substrate 3 is described in the present embodiment with the following structure. However, the specific structure of the substrate 3 can be adjusted and changed according to design requirements, and is not limited thereto.

The substrate 3 includes a first insulation layer 31, a first metal layer 32, a second insulation layer 33, a second metal layer 34, and a third metal layer 35. The first metal layer 32 and the second insulation layer 33 are arranged on two opposite sides of the first insulation layer 31, respectively. The second metal layer 34 and the third metal layer 35 are formed on the second insulation layer 33.

In the present embodiment, the first insulation layer 31 is in a step-shape, and the first insulation layer 31 has a lower step portion 311 and two upper step portions 312. The two upper step portions 312 are formed on the lower step portion 311 and are spaced apart from each other. The first metal layer 32 is formed on the two upper step portions 312 of the first insulation layer 31.

In the present embodiment, the first metal layer 32 includes an integrated circuit (IC) chip bonding region 321 and a light-emitting diode (LED) chip bonding region 322 that are respectively arranged on the two upper step portions 312.

The second insulation layer 33 is connected to the lower step portion 311 of the first insulation layer 31, and the second metal layer 34 is embedded in the first insulation layer 31 and the second insulation layer 33. The third metal layer 35 is arranged on a side of the second insulation layer 33 away from the first insulation layer 31.

The second metal layer 34 includes a plurality of extension wires 341 spanning the two upper step portions 312 and a plurality of conductive posts 342 connected to the extension wires 341. Through the conductive posts 342, the second metal layer 34 is correspondingly connected to the LED chip bonding region 322, the IC chip bonding region 321, and the third metal layer 35. Accordingly, the second metal layer 34 and the third metal layer 35 can be electrically coupled to each other, and the LED chip bonding region 322 can be electrically coupled to the IC chip bonding region 321 through the second metal layer 34.

Specifically speaking, in the present embodiment, the substrate 3 can further include an upper solder mask layer 36 and a lower solder mask layer 37. The upper solder mask layer 36 and the lower solder mask layer 37 are arranged on two opposite sides of the substrate 3, respectively. The upper solder mask layer 36 is formed on the first insulation layer 31. More specifically, the upper solder mask layer 36 is formed on the two upper step portions 312 of the first insulation layer 31. A plurality of perforations 361 are formed on the upper solder mask layer 36, so as to expose the IC chip bonding region 321 and the LED chip bonding region 322.

In the present embodiment, the upper solder mask layer 36 has a light-emitting diode (LED) chip solder mask area 363 and an integrated circuit (IC) chip solder mask area 362. The LED chip solder mask area 363 and the IC chip solder mask area 362 are spaced apart from each other, and the perforations 361 are formed on each of the LED chip solder mask area 363 and the IC chip solder mask area 362. More specifically, the LED chip solder mask area 363 and the IC chip solder mask area 362 are disposed on the two upper step portions 312. Furthermore, the lower solder mask layer 37 is disposed on the side of the second insulation layer 33 and is arranged adjacent to the third metal layer 35.

The surrounding wall 4 is disposed on the substrate 3 to define a first accommodating space 41 and a second accommodating space 42. The first accommodating space 41 corresponds in position to the IC chip solder mask area 362, and the second accommodating space 42 corresponds in position to the LED chip solder mask area 363. The IC flip-chip 1 is arranged in the first accommodating space 41, and the LED flip-chips 2 are arranged in the second accommodating space 42.

The light-permeable package body 5 is disposed on the substrate 3 and filled in the first accommodating space 41 and the second accommodating space 42, so that the IC flip-chip 1 and the LED flip-chips 2 are embedded therein. However, the present disclosure is not limited thereto. For instance, in embodiments not shown in the present disclosure, the light-permeable package body 5 can be filled only in the second accommodating space 42, so that the LED flip-chips 2 are embedded therein. Accordingly, in the present disclosure, the light-permeable package body 5 is filled at least in the second accommodating space 42.

Specifically speaking, in the present embodiment, the light-permeable package body 5 has a light emergent surface 51 that is parallel to the substrate 3 and faces toward a side that is away from the substrate 3. In the present embodiment, the light emergent surface 51 is coplanar with a top surface of the surrounding wall 4, but is not limited thereto.

Second Embodiment

Figure 8:
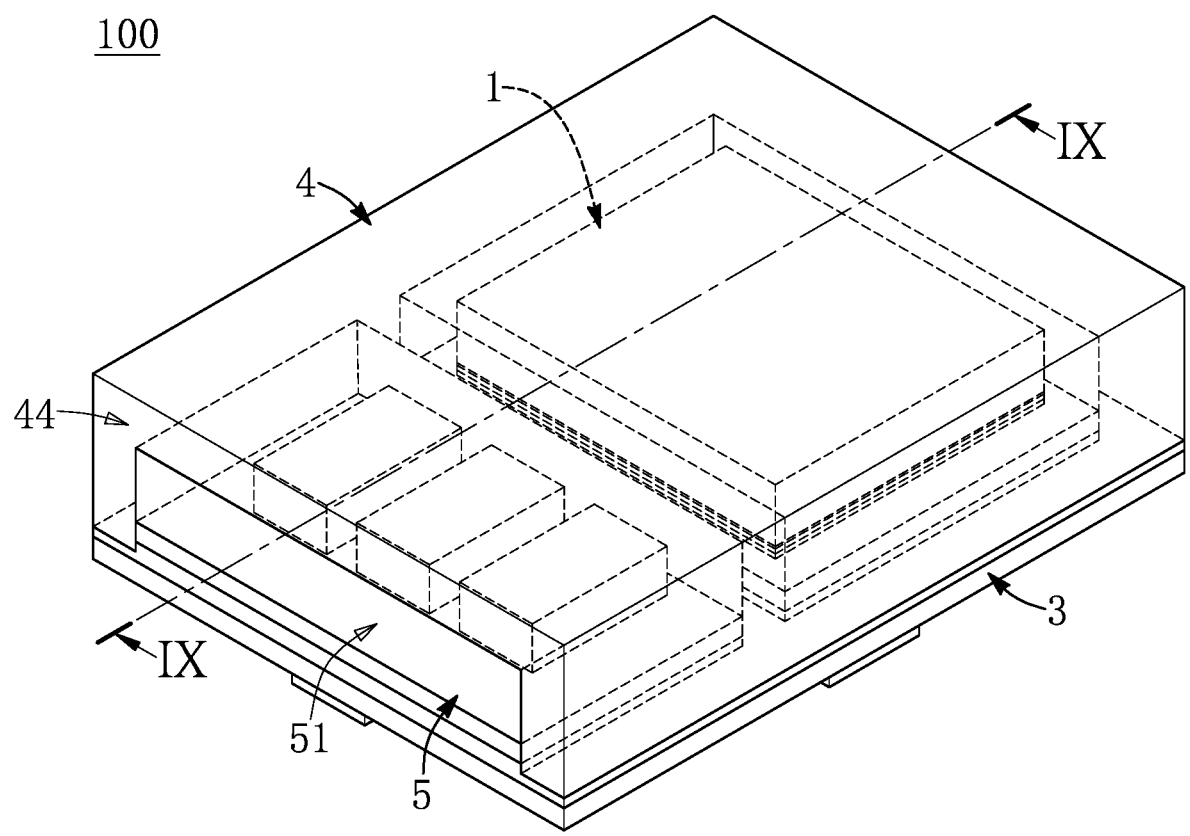
FIG. 8 is a perspective view of the light-emitting device according to a second embodiment of the present disclosure.
Figure 9:
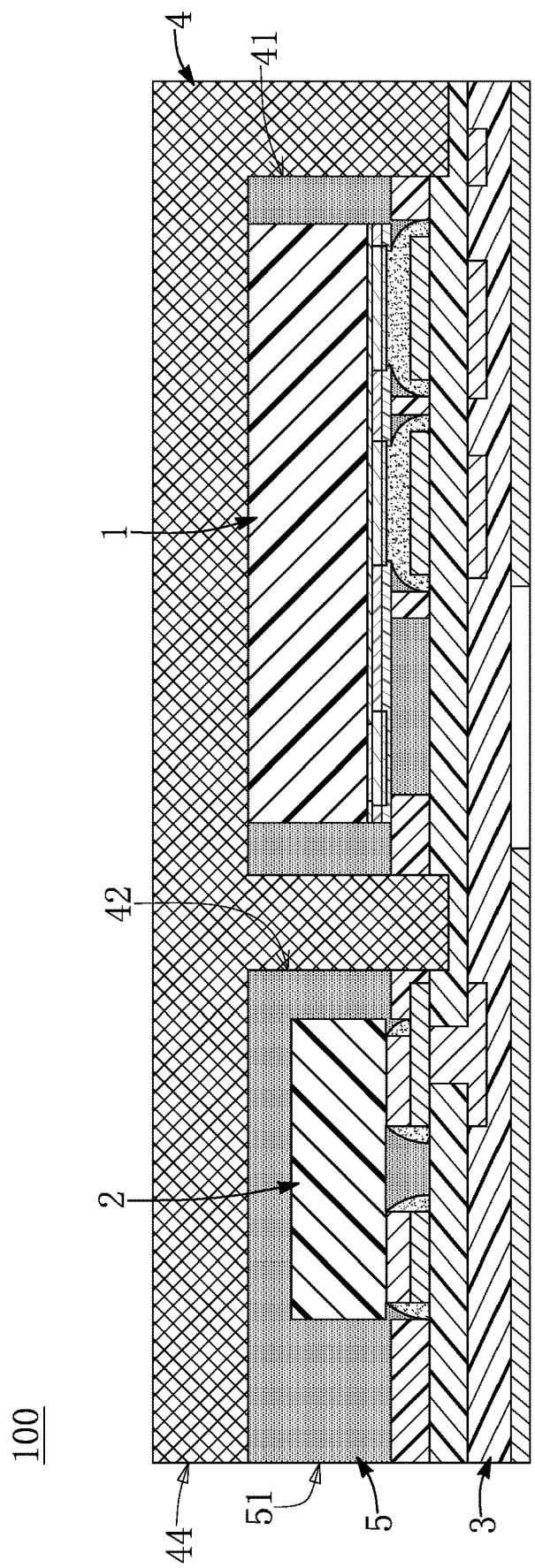
FIG. 9 is a cross-sectional view taken along line IX-IX of FIG. 8.

Referring to FIG. 8 and FIG. 9, a second embodiment of the present disclosure is shown. Since the second embodiment is similar to the first embodiment above, the similarities of the two embodiments will not be reiterated. The differences between the second embodiment and the first embodiment above are briefly described as follows.

In the present embodiment, the light emergent surface 51 is perpendicular to the substrate 3 and faces toward a side that is away from the IC flip-chip 1. The light emergent surface 51 is not located on a top surface of the light-permeable package body 5. That is, the light emergent surface 51 is located on a side of the light-emitting device 100 and is coplanar with a side edge surface 44 of the surrounding wall 4. Furthermore, the first accommodating space 41 is a closed space wrapped in the surrounding wall 4. That is, the IC flip-chip 1 in the first accommodating space 41 and a corresponding part of the light-permeable package body 5 are embedded in the surrounding wall 4.

Third Embodiment

Figure 10:
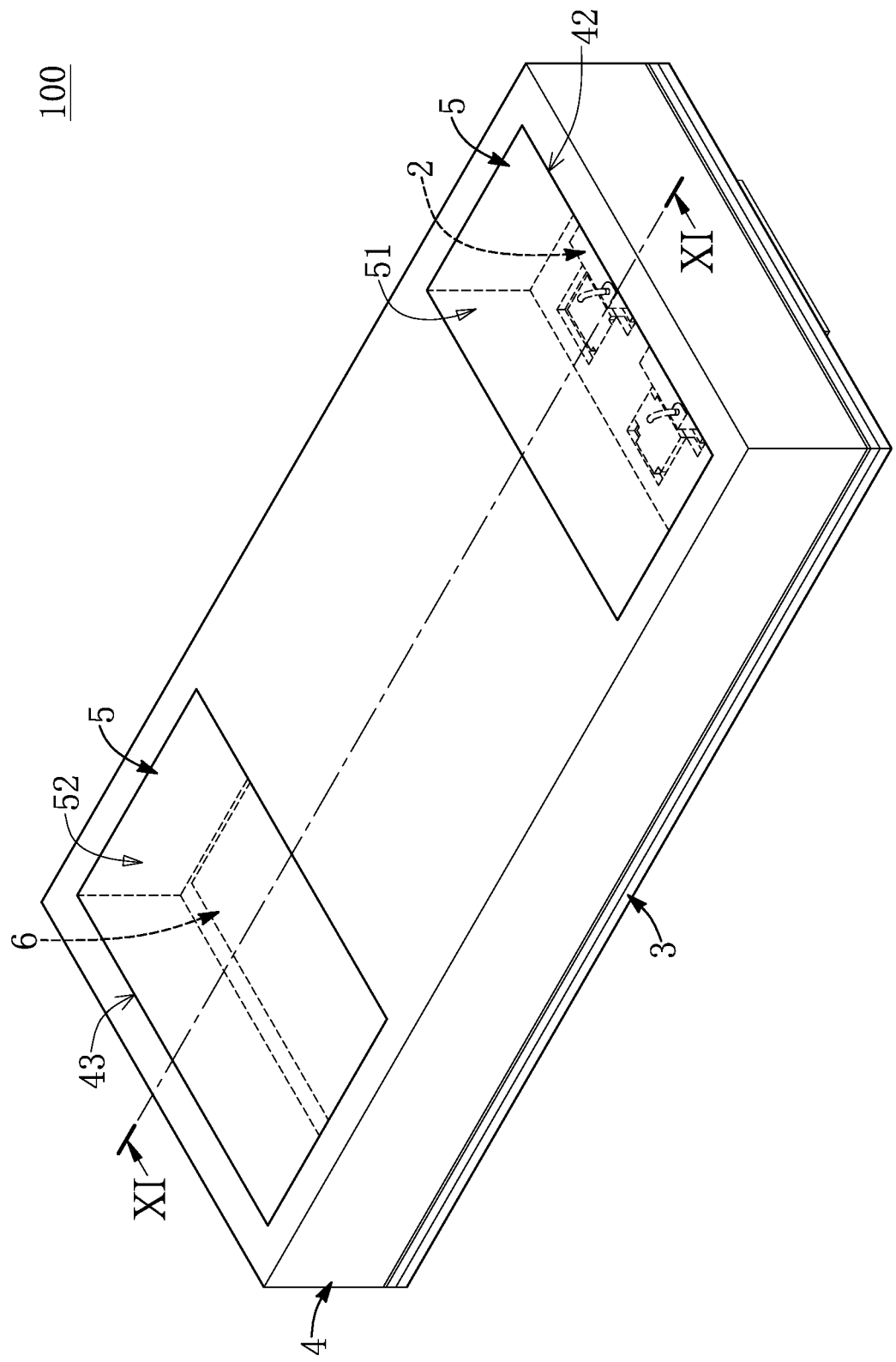
FIG. 10 is a perspective view of the light-emitting device according to a third embodiment of the present disclosure.
Figure 11:
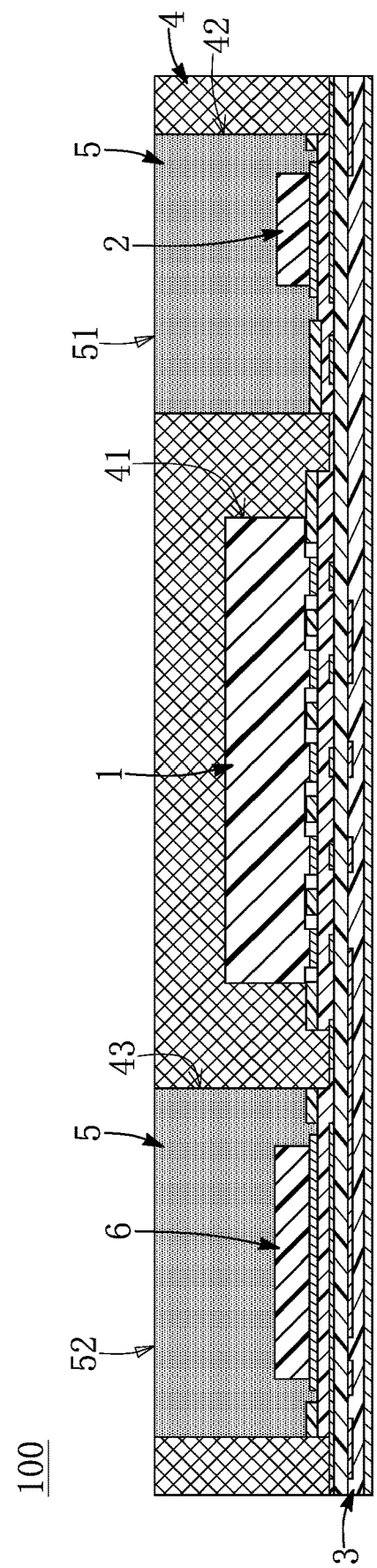
FIG. 11 is a cross-sectional view taken along line XI-XI of FIG. 10.

Referring to FIG. 10 and FIG. 11, a third embodiment of the present disclosure is shown. Since the third embodiment is similar to the first embodiment above, the similarities of the two embodiments will not be reiterated. The differences between the third embodiment compared with the first embodiment above are briefly described as follows.

In the present embodiment, the IC flip-chip 1 is covered and embedded in the surrounding wall 4. That is, a space occupied by the IC flip-chip 1 in the surrounding wall 4 is the first accommodating space 41. The surrounding wall 4 further defines a third accommodating space 43, and the first accommodating space 41 is arranged between the second accommodating space 42 and the third accommodating space 43.

The light-emitting device 100 further includes a light sensor 6 arranged in the third accommodating space 43. The light-permeable package body 5 is filled in the second accommodating space 42 and the third accommodating space 43, so that the LED flip-chips 2 and the light sensor 6 are embedded therein. It should be noted that the LED flip-chips 2 can include two green LED chips and an infrared light chip, but are not limited thereto.

More specifically, in the present embodiment, the light-permeable package body 5 includes a light emergent surface 51 that corresponds in position to the LED flip-chips 2 and a light incident surface 52 that corresponds in position to the light sensor 6. The light emergent surface 51 and the light incident surface 52 are parallel to the substrate 3 and face toward a side that is away from the substrate 3.

In the present embodiment, the light emergent surface 51 and the light incident surface 52 are coplanar with the top surface of the surrounding wall 4. However, the present disclosure is not limited thereto. In the present embodiment, the light-emitting device 100 simultaneously integrates the IC flip-chip 1 (e.g., an analog front-end chip), light sources, and the light sensor 6. Accordingly, the light-emitting device 100 is more suitable for thin and light wearable devices, and is configured to provide a light-emitting diode package structure that is smallest in size and thinnest in thickness.

Fourth Embodiment

Figure 12:
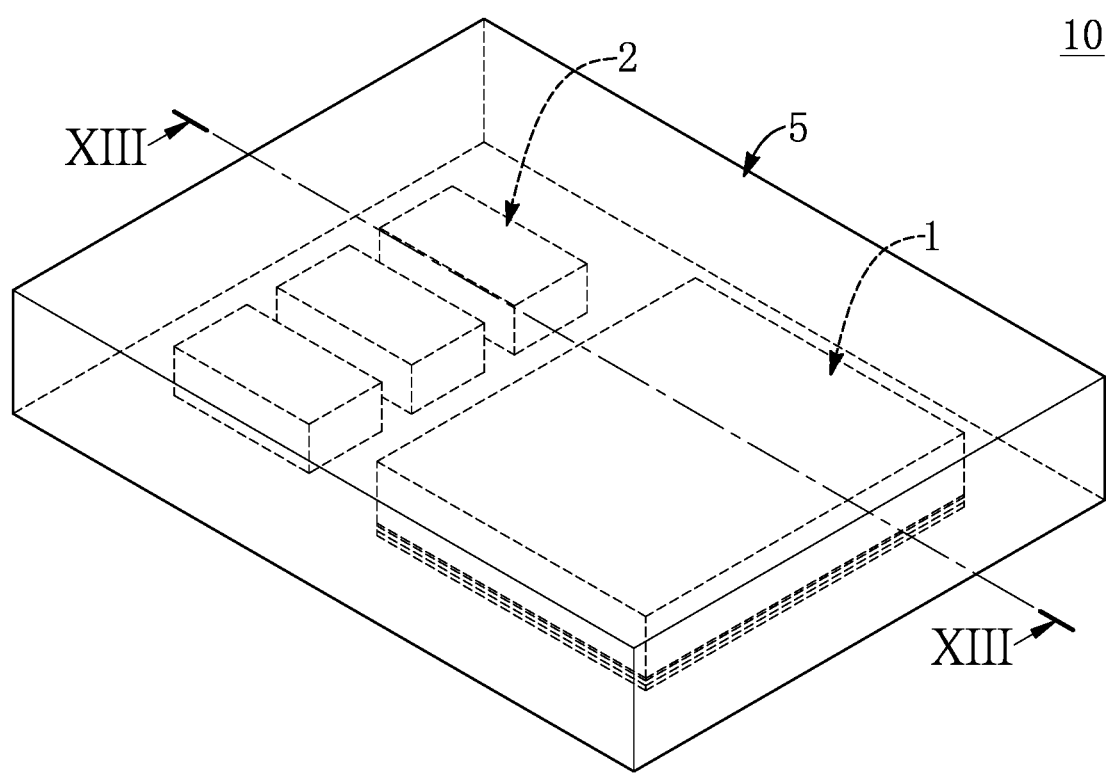
FIG. 12 is a perspective view of a light-emitting assembly according to a fourth embodiment of the present disclosure.
Figure 13:
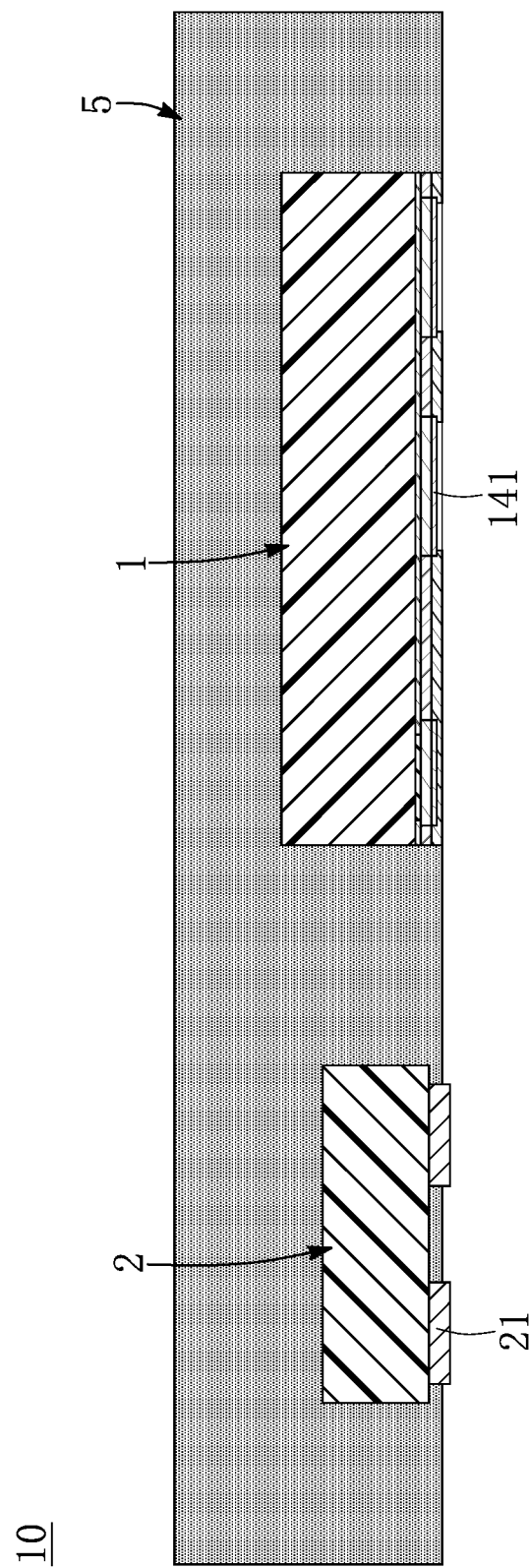
FIG. 13 is a cross-sectional view taken along line XIII-XIII of FIG. 12.

Referring to FIG. 12 and FIG. 13, a fourth embodiment of the present disclosure is shown. Since the fourth embodiment is similar to the first embodiment above, the similarities of the two embodiments will not be reiterated. The differences between the fourth embodiment compared with the first embodiment above are briefly described as follows.

In the present embodiment, a light-emitting assembly 10 is provided, and a difference between the light-emitting assembly 10 and the light-emitting device 100 of the first embodiment is that the light-emitting assembly 10 does not include the substrate 3. The light-emitting assembly 10 includes an integrated circuit (IC) flip-chip 1, a plurality of light-emitting diode (LED) flip-chips 2 spaced apart from the IC flip-chip 1, and a light-permeable package body 5.

In the present embodiment, since the IC flip-chip 1 and the LED flip-chips 2 are similar to those of the first embodiment above, details thereof will not be reiterated herein. The LED flip-chips 2 can be one of red LED chips, blue LED chips and green LED chips, or a combination thereof, but are not limited thereto.

In the present embodiment, the light-emitting assembly 10 does not include the substrate 3 of the first embodiment, and the light-permeable package body 5 is an integrally formed one-piece structure and covers the IC flip-chip 1 and the LED flip-chips 2. The flip-chip pads 141 of the IC flip-chip 1 and the electrodes 21 of the LED flip-chips 2 are exposed outside of the light-permeable package body 5 and are configured to be mounted on a predetermined object (such as a circuit board or a substrate).

Beneficial Effects of the Embodiments

In conclusion, in the light-emitting device, the light-emitting assembly and the IC flip-chip provided in the present embodiments, the flip-chip pads with specific location conditions can be formed through the redistribution layer. For instance, the flip-chip pads are arranged within the layout boundary, and at least one of the flip-chip pads is spaced apart from the layout boundary. Accordingly, the IC flip-chip can be applied in the flip-chip process.

Furthermore, the projection area formed by the orthographic projection of the flip-chip pads on the surface of the chip body. The projection area locates on the nine-square grid area, and the number of spaces of the nine-square grid area on which the projection area is located is equal to the number of spaces of the nine-square grid area on which the metal pads are located. Accordingly, the flip-chip pads can be more evenly distributed, so as to facilitate a stable connection with even wetting and less rotation during the flip-chip process.

Furthermore, the projection area formed by the orthographic projection of the flip-chip pads on the surface of the chip body does not cover any one of the metal pads. Accordingly, any one of the flip-chips and the corresponding metal pads will not interfere with each other and affect the yield rate caused by the formation of the redistribution layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting device, comprising:
   an integrated circuit (IC) flip-chip including a plurality of flip-chip pads;
   a plurality of light-emitting diode (LED) flip-chips spaced apart from the IC flip-chip;
   a substrate carrying the IC flip-chip and the LED flip-chips, wherein the LED flip-chips have a plurality of electrodes, and the flip-chip pads of the IC flip-chip and the electrodes of the LED flip-chips are disposed on the substrate by way of soldering, and wherein the LED flip-chips are electrically coupled to the IC flip-chip through the substrate; and
   a surrounding wall disposed on the substrate to define a first accommodating space and a second accommodating space, wherein the IC flip-chip is arranged in the first accommodating space, and the LED flip-chips are arranged in the second accommodating space.

2. The light-emitting device according to claim 1, wherein the IC flip-chip includes:
   a chip body;
   a plurality of metal pads disposed on a surface of the chip body, wherein edges of the metal pads define a layout boundary, and the metal pads are arranged within the layout boundary;
   a redistribution layer formed on the surface of the chip body, wherein the metal pads are embedded in the redistribution layer;
   a metal layer disposed on the redistribution layer and electrically coupled to the metal pads through the redistribution layer; and
   a solder mask layer having a plurality of openings and being disposed on the metal layer, wherein the flip-chip pads are defined by the metal layer to be exposed from the solder mask layer through the openings and are arranged within the layout boundary, and wherein at least one of the flip-chip pads is spaced apart from the layout boundary.

3. The light-emitting device according to claim 2, wherein each of the flip-chip pads has a same area, and the area of any one of the flip-chip pads is larger than an area of the metal pad that is electrically coupled thereto.

4. The light-emitting device according to claim 1, wherein the substrate includes:
   a first insulation layer;
   a first metal layer formed on the first insulation layer, wherein the first metal layer includes an integrated circuit (IC) chip bonding region and a light-emitting diode (LED) chip bonding region;
   a second insulation layer, wherein the second insulation layer and the first metal layer are respectively arranged on two opposite sides of the first insulation layer; and
   a second metal layer and a third metal layer electrically coupled to each other, wherein the LED chip bonding region is electrically coupled to the IC chip bonding region through the second metal layer, and wherein the third metal layer is arranged on a side of the second insulation layer away from the first insulation layer.

5. The light-emitting device according to claim 4, wherein the substrate includes:
   an upper solder mask layer formed on the first insulation layer, wherein a plurality of perforations are formed on the upper solder mask layer, so as to expose the IC chip bonding region and the LED chip bonding region; and
   a lower solder mask layer disposed on the second insulation layer and arranged adjacent to the third metal layer.

6. The light-emitting device according to claim 5, wherein the upper solder mask layer has a light-emitting diode (LED) chip solder mask area and an integrated circuit (IC) chip solder mask area, and wherein the LED chip solder mask area and the IC chip solder mask area are spaced apart from each other, and the perforations are formed on each of the LED chip solder mask area and the IC chip solder mask area.

7. The light-emitting device according to claim 1, further comprising:
   a light-permeable package body filled at least in the second accommodating space, wherein the LED flip-chips are embedded in the light-permeable package body.

8. The light-emitting device according to claim 7, wherein the light-permeable package body has a light emergent surface, and wherein the light emergent surface is parallel to the substrate and faces toward a side that is away from the substrate, or is perpendicular to the substrate and faces toward a side that is away from the IC flip-chip.

9. The light-emitting device according to claim 7, wherein the surrounding wall further defines a third accommodating space, and the first accommodating space is arranged between the second accommodating space and the third accommodating space, and wherein the light-emitting device further includes a light sensor arranged in the third accommodating space.

10. A light-emitting assembly, comprising:
    an integrated circuit (IC) flip-chip including a plurality of flip-chip pads;
    a plurality of light-emitting diode (LED) flip-chips spaced apart from the IC flip-chip; and
    a light-permeable package body being an integrally formed one-piece structure and covering the IC flip-chip and the LED flip-chips, wherein the light-emitting assembly does not include any substrate for carrying the IC flip-chip and the LED flip chips, the LED flip-chips have a plurality of electrodes, and the flip-chip pads of the IC flip-chip and the electrodes of the LED flip-chips are exposed outside of the light-permeable package body.

11. An integrated circuit (IC) flip-chip, comprising:
    a chip body;
    a plurality of metal pads disposed on a surface of the chip body;
    a redistribution layer formed on the surface of the chip body, wherein the metal pads are embedded in the redistribution layer; and
    a plurality of flip-chip pads disposed on the redistribution layer and electrically coupled to the metal pads through the redistribution layer, wherein the flip-chip pads and the metal pads each have a layout distribution, and the layout distribution of the flip-chip pads is more even than the layout distribution of the metal pads.

12. The IC flip-chip according to claim 11, wherein a projection area formed by an orthographic projection of the flip-chip pads on the surface of the chip body does not cover any one of the metal pads.

13. The IC flip-chip according to claim 11, wherein edges of the metal pads define a layout boundary, and the metal pads are arranged within the layout boundary, wherein the layout boundary defines a nine-square grid area, and a projection area is formed by an orthographic projection of the flip-chip pads on the surface of the chip body, and wherein a number of spaces of the nine-square grid area on which the projection area is located is greater than a number of spaces of the nine-square grid area on which the metal pads are located.

14. The IC flip-chip according to claim 11, wherein edges of the metal pads define a layout boundary, and the metal pads are arranged within the layout boundary, and wherein edges of part of the flip-chip pads are partially located on the layout boundary, and a remaining part of the flip-chip pads is spaced apart from the layout boundary.

15. The IC flip-chip according to claim 11, wherein the redistribution layer includes:
- a first polymer layer formed on the surface of the chip body and arranged at a periphery of the metal pads;
- a wire extension layer disposed on the first polymer layer and the metal pads, wherein the wire extension layer is electrically coupled to the metal pads; and
- a second polymer layer arranged around the wire extension layer, wherein the wire extension layer protrudes out of the second polymer layer.

16. The IC flip-chip according to claim 15, wherein the redistribution layer includes a solder mask layer that is disposed on the second polymer layer and the wire extension layer, and the flip-chip pads are exposed from the solder mask layer.

* * * * *